United States Patent [19]
Tanaka

[11] Patent Number: 5,384,496
[45] Date of Patent: Jan. 24, 1995

[54] SAMPLE AND HOLD CIRCUIT

[75] Inventor: Shigeki Tanaka, Nara, Japan

[73] Assignee: Sharp Kabushiki Kaisha, Osaka, Japan

[21] Appl. No.: 85,039

[22] Filed: Jul. 2, 1993

[30] Foreign Application Priority Data

Jul. 9, 1992 [JP] Japan .................. 4-182280

[51] Int. Cl.⁶ .................. G11C 27/02; H03K 5/159
[52] U.S. Cl. .................................. 327/94; 327/91
[58] Field of Search ............... 307/353, 352, 241, 246; 328/151

[56] References Cited

U.S. PATENT DOCUMENTS

| | | | |
|---|---|---|---|
| 4,698,523 | 10/1987 | Gershon et al. | 328/151 |
| 4,823,027 | 4/1989 | Takahashi | 328/151 |
| 4,914,319 | 4/1990 | Hashimoto | 307/353 |
| 5,252,956 | 10/1993 | Senn et al. | 307/353 |
| 5,252,957 | 10/1993 | Itakura | 307/353 |

FOREIGN PATENT DOCUMENTS

| | | | |
|---|---|---|---|
| 0062399 | 3/1991 | Japan | 307/353 |
| 3177890 | 8/1991 | Japan . | |
| 415684 | 1/1992 | Japan . | |

Primary Examiner—Timothy P. Callahan
Assistant Examiner—Toan Tran

[57] ABSTRACT

A sample and hold circuit is arranged to have a common input bus line and a plurality of combinations of analog switches and capacitors connected to the command input bus line. The sample and hold circuit includes as features a signal feeding unit for sequentially feeding a sampling control signal to the analog switches and a preventing unit for preventing the plurality of analog switches from being made conductive at one time because of the delay of the sampling control signal.

7 Claims, 10 Drawing Sheets

SAMPLE AND HOLD CIRCUIT

BACKGROUND OF THE INVENTION

1. Field of the Invention

The present invention relates to a sample and hold circuit and more particularly to the sample and hold circuit which is used for sampling a video signal in an integrated circuit for driving active matrix liquid crystal.

2. Description of the Related Art

Before describing the sample and hold circuit known by the inventors of the present application, the driving circuit for liquid crystal with which the sample and hold circuit of this invention concerns will be described. Such a driving circuit is typically arranged to have a plurality of-signal electrodes located in parallel, a plurality of scan electrodes crossed with those signal electrodes, pixel electrodes provided near each of the cross points between the signal electrodes and the scan electrodes, opposite electrodes located in opposition to the pixel electrodes, and auxiliary capacitance electrodes located in a manner to form capacitances with the pixel electrodes. The later description will be expanded as taking an example of an active matrix liquid crystal display unit. However, it goes without saying that this invention is applicable to an electroluminescent display unit and a plasma display unit.

FIG. 1 exemplarily shows the known active matrix liquid crystal display unit. As shown, this display unit provides a TFT (Thin Film Transistor) liquid crystal panel 100 having TFTs 104 served as switching elements for driving the pixel electrodes 103 arranged in a matrix manner. The TFT liquid crystal panel 100 includes a plurality of scan electrodes 101 located in parallel to one another and a plurality of signal electrodes 102 crossed with and located in parallel to the scan electrodes 101. The TFT 104 for driving the pixel electrode 103 is provided closer to each cross point between the scan electrode 101 and the signal electrode 102. Opposite electrodes 105 are provided as opposed to the pixel electrodes 103, respectively. The opposite electrode 105 is exemplarily shown in FIG. 1. Normally, however, it is composed of one conductive layer commonly located to all the pixel electrodes 103. A certain amount of voltage Ve is applied to the opposite electrode 105. The TFT liquid crystal panel 100 further includes a plurality of auxiliary capacitance electrodes 106, which will be discussed later.

The TFT liquid crystal panel 100 is driven by a driving circuit including a source driver 200 and a gate driver 300. The source driver 200 is connected to the signal electrodes 102 of the TFT panel 100. The gate driver 300 is connected to the scan electrodes 101 of the TFT panel 100. The source driver 200 operates to sample and hold an analog image signal or a video signal input thereto and then feed it to the signal electrodes 102. The gate driver 300 operates to sequentially output a scan pulse to the scan electrodes 101. Various control signals such as a timing signal input to the gate driver 800 and the source driver 200 are fed from a control circuit 400.

Then, the source driver 200 will be discussed in detail as referring to FIG. 2. The source driver 200 includes a shift register 210, a sample and hold circuit 220 and an output buffer 280. The shift register 210 operates to shift a shift pulse input from the control circuit 800 on the shift clocks and sequentially output a sampling pulse to the lines B1, B2 ... Bi ... Bm on shift clocks. Based on the sampling pulse, the analog switches ASWI(1) ... ASWi(i) ... ASWi(m) in [he sample and hold circuit 220 are sequentially made conductive. The sampling capacitor 221 is charged up to the same level as the instantaneous amplitude v(i, j) of the input analog image signal. Herein, v(i, j) denotes an instantaneous amplitude of an analog image signal to be written in the pixel electrode 103 corresponding to a cross point between the i-th signal electrode and the j-th scan electrode. After the sample and hold circuit 220 takes sampling of an image signal for one horizontal scan period, an output pulse OE is applied to the source driver so that the image signal is shifted from the sampling capacitor 221 to the holding capacitor 222. The image signal held in the holding capacitor 222 is output to the signal electrode 102 through the output buffer 230.

FIG. 3 schematically shows a waveform of an I/O signal in the source driver 200. In FIG. 8, v(CSPL(i)), v(CH(i)) and Vs(i) denote a voltage in the i-th sampling capacitor 221, a voltage in the i-th holding capacitor 222 and an output voltage of the i-th output buffer 230, respectively. As shown in FIG. 3, the signal electrode 102 is normally driven by an ac voltage in a manner that the polarity of the applied voltage against the voltage applied on the opposite electrode 105 in one field is different from that in the adjacent field.

FIG. 4 shows an equivalent circuit of a pixel. As shown in FIG. 4, in addition to a pixel capacitance CLC formed between the pixel electrode 103 and the opposite electrode 105, an auxiliary capacitance Cs is formed between the pixel electrode 103 and the auxiliary capacitance electrode 106. In the TFT liquid crystal panel 100, even if the signal electrode 102 is ac driven, an ac waveform applied to the liquid crystal element is made asynchronous. A polarized electric field due to the asynchrony is formed in the liquid crystal element. This polarized electric field leads to lowering the reliability of the liquid crystal element. The addition of the auxiliary capacitance Cs is intended for improving such a disadvantage and reducing a flicker phenomenon. The pixel electrode 103 serves as one electrode of the auxiliary capacitance Cs. As the other electrode of the auxiliary capacitance Cs, that is, the connecting system of the auxiliary capacitance electrode 106, the following two systems are known.

In the first system, as shown in FIG. 1, the auxiliary capacitance electrode 106 corresponding to the j-th scan electrode 101 is electrically connected to the adjacent (j-l) th scan electrode 101. However, the auxiliary capacitance electrode 106 corresponding to the (j=0) th scan electrode 101 is connected to the opposite electrode 105. This system is referred to as a Cs on-gate system.

In the second system, as shown in FIG. 5, the auxiliary capacitance electrode 106 is electrically connected to the opposite electrode 105. In this case, the voltage vx of the auxiliary capacitance electrode 106 is equal to the voltage vc of the opposite electrode 105.

In the second system, it is necessary to wire a pick-up bus line for connecting the auxiliary capacitance electrode 106 to the opposite electrode 105 in parallel to the scan electrode. This results in bringing about the disadvantage of lowering a numerical aperture. On the other hand, since the gate electrode serves as the pick-up bus line, the first system is more advantageous in light of the numerical aperture.

The known source driver is arranged of a logic circuit such as a counter and a shift register operated on a low voltage, and a middle voltage endurance section such as a sample and hold circuit, a level shifter circuit, and an output buffer. To manufacture the part operating on different voltages as a monolithic LSI, it is necessary to employ a design rule and a manufacture process suited to the middle voltage endurance section.

FIG. 6 shows a sample and hold circuit known by the inventors of the present applicant. The timing of the known sample and hold circuit is shown in FIG. 7. It is basically equal to the timing of the present invention.

The known sample and hold circuit operates to sequentially switch on and off the analog switch Gn on the timing of an output signal Qn of a shift register 2 and take sampling of the data in the corresponding capacitor Cn for holding an analog signal Vi input to an input bus line 1 for a certain interval.

Consider the case that the analog switch is continuously switched on and off in the known circuit. Since the trailing edge of the n-th sampling gate signal is the same timing as the leading edge of the (n+1) th sampling gate signal, the (n+1) th gate is switched on before the n-th gate Gn is completely switched off because the waveform of this gate signal is transformed or delayed. If the-sampling gate as shown in FIG. 6 is composed of an analog switch made of P-MOS and N-MOS, it is known that the adjacent gates remain on at the same time for a longer interval of time.

On the other hand, when the sampling gate Gn+1 is switched on, the charge or discharge of the capacitance Cn+1 may give an adverse effect to the input bus line as noises in some histories of the voltage level accumulated in the sampling capacitance Cn+1. Hence, the sampling capacitance Cn does not disadvantageously reach the necessary input level.

SUMMARY OF THE INVENTION

It is therefore an object of the present invention to provide a sample and hold circuit which operates to reduce the adverse effect of the noises when sampling the signal and improve the sampling accuracy.

In carrying out the object, a sample and hold circuit includes a common input bus line; a plurality of combinations of analog switches and capacitors connected to the input bus line; means for sequentially supplying a sampling control signal to the analog switches; and means for preventing the plurality of analog switches from being made conductive at the same time because of the delay.

In operation, the preventing means is provided for preventing a plurality of analog switches from being made conductive at one time because of the delay of a sampling control signal. The preventing operation makes it possible to avoid overlapping the adjacent sampling gate signals. Furlher, it makes contribution to lessening the adverse effect of.the noises appearing on the analog input signal line when the sampling period is terminated and the analog switch is switched off.

That is, the sample and hold circuit according to this invention is free from the adverse effect of the noises on the input bus line when sampling the signal with quite simple circuitry and improve the sampling accuracy.

Further objects and advantages of the present invention will be apparent from the following description of the preferred embodiment of the invention as illustrated in the accompanying drawings.

DESCRIPTION OF THE PREFERRED EMBODIMENTS

Figure 8:
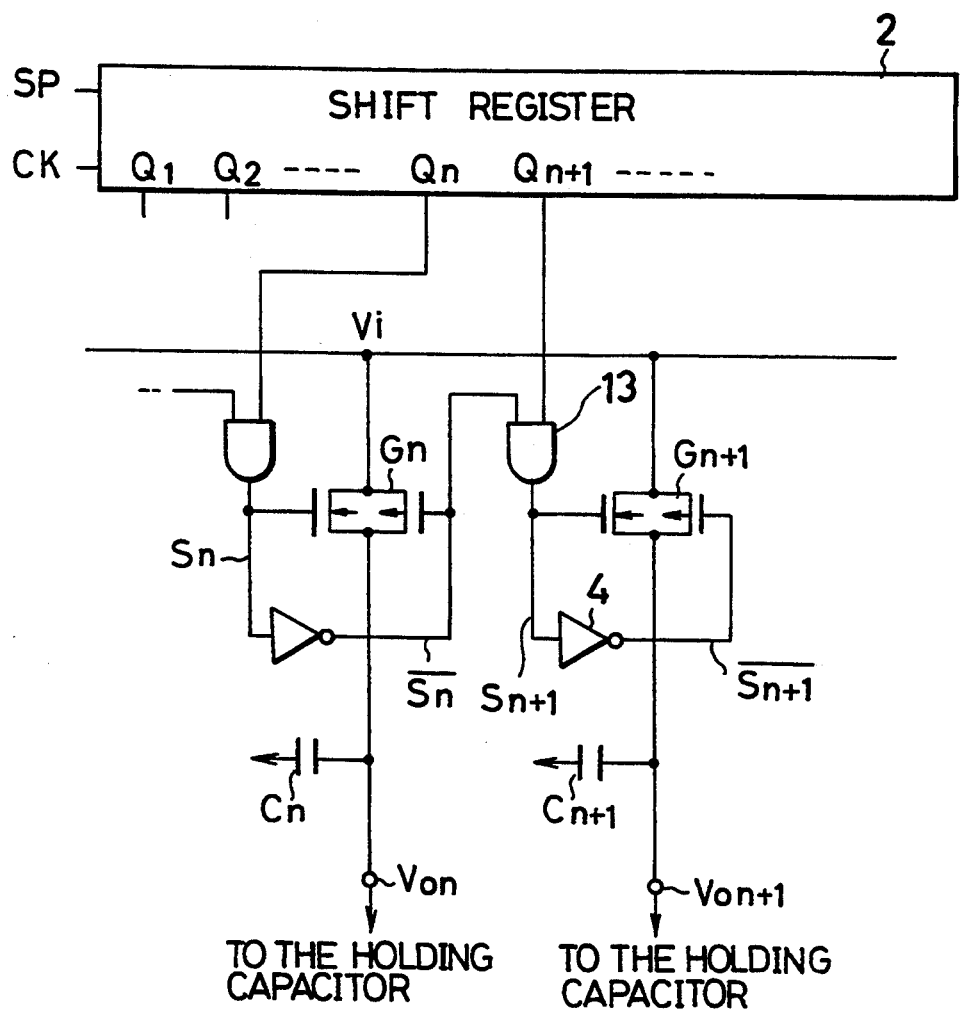
FIG. 8 is a circuit diagram showing a sample and hold circuit according to an embodiment of the present invention.

FIG. 8 shows a sample and hold circuit according to an embodiment of the present invention. The sample and hold circuit includes an input bus line, a shift register having N output terminals, and N sample and hold signal output terminals. Between the input bus line and the output terminals for the sample and hold signals, transmission gates, that is, analog switches are connected. The H (High-active) terminal of the control terminal, that is, the gate terminal of the analog switch is connected to the output terminal of an AND circuit. One of the two input terminals of the AND circuit is connected to an L (Low-active) terminal of the lower switch and the other one is connected to the output terminal of the register. An inverter is connected between the L terminal and the H terminal. Between the output terminals for the sample and hold signal and the GND, a capacitor is connected for forming a sampling capacitance.

Figure 1:
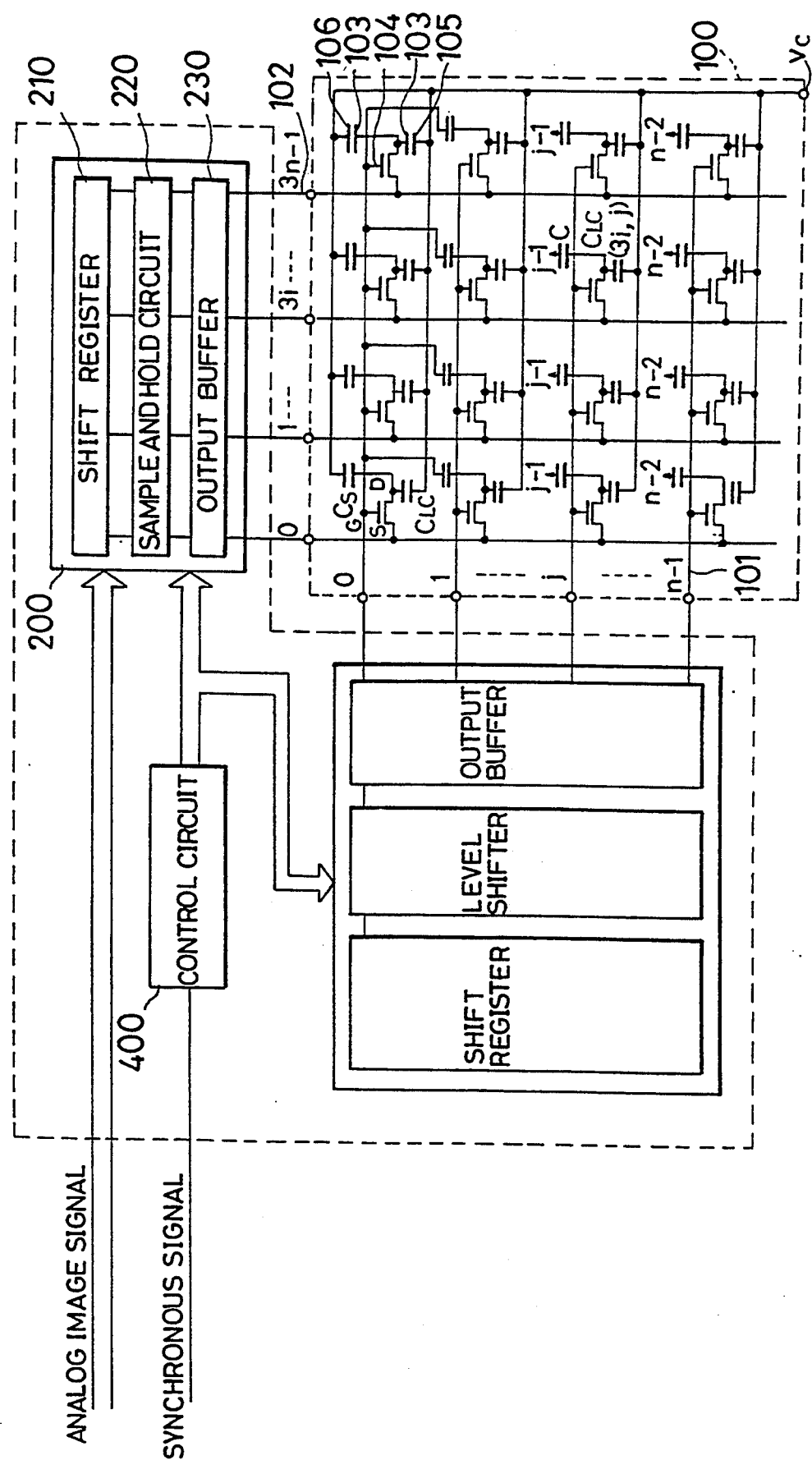
FIG. 1 is an exemplary view showing an active matrix liquid crystal display unit according to the related art of the invention.
Figure 2:
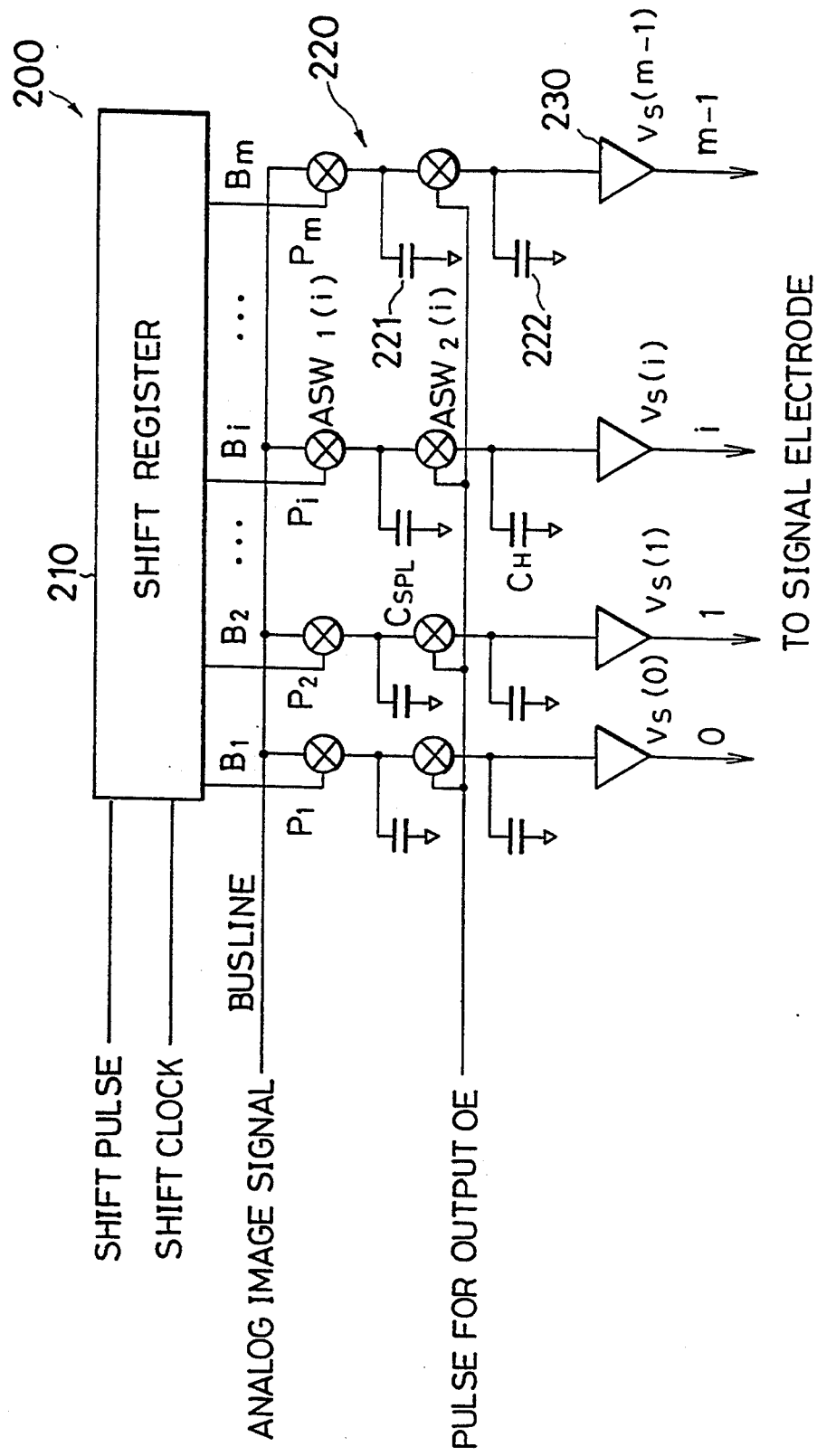
FIG. 2 is a circuit diagram showing a source driver included in the known liquid crystal display unit.
Figure 3:
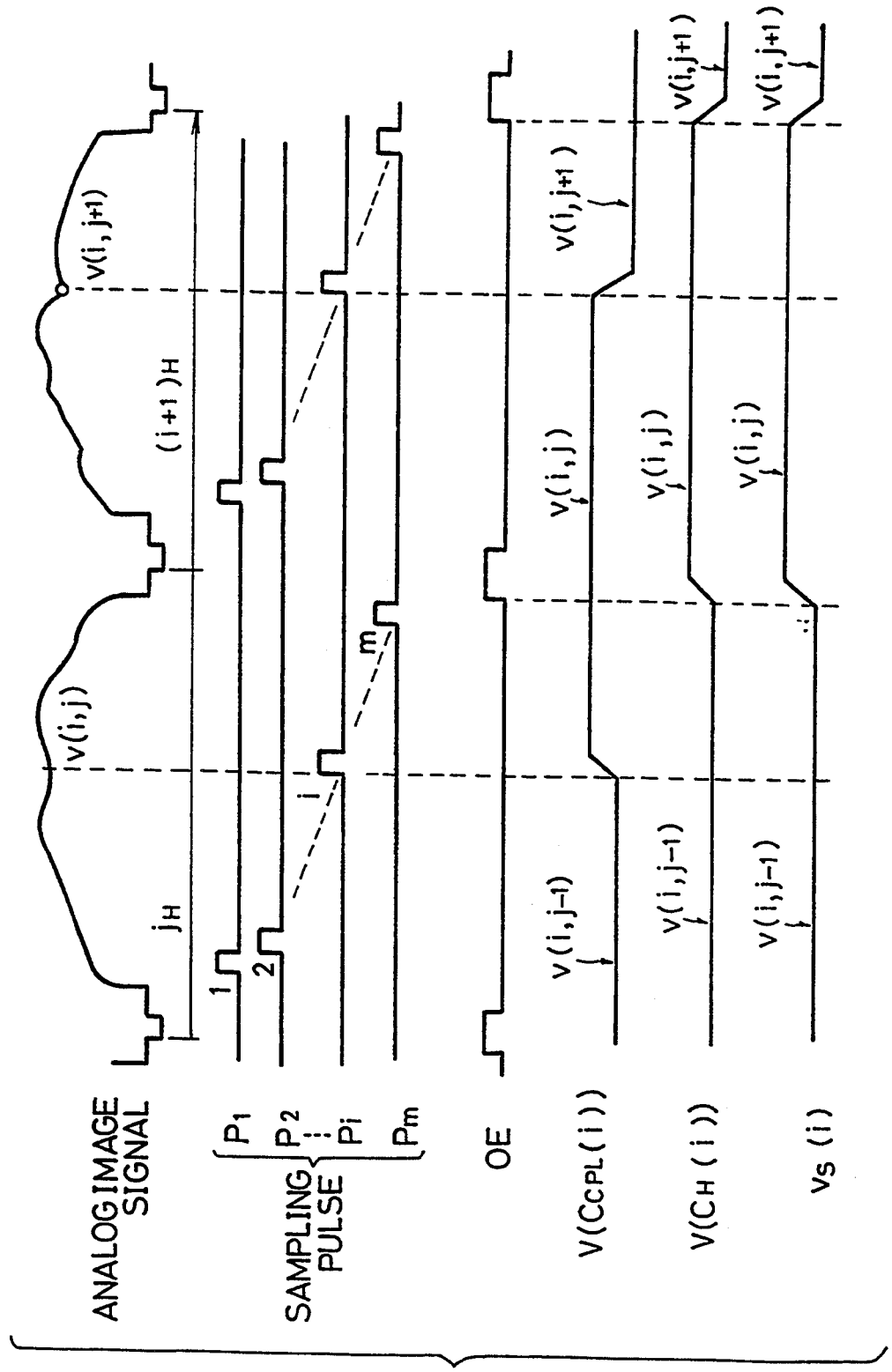
FIG. 3 is a schematic view showing waveforms of I/O signals used in the source driver shown in FIG. 2.
Figure 4:
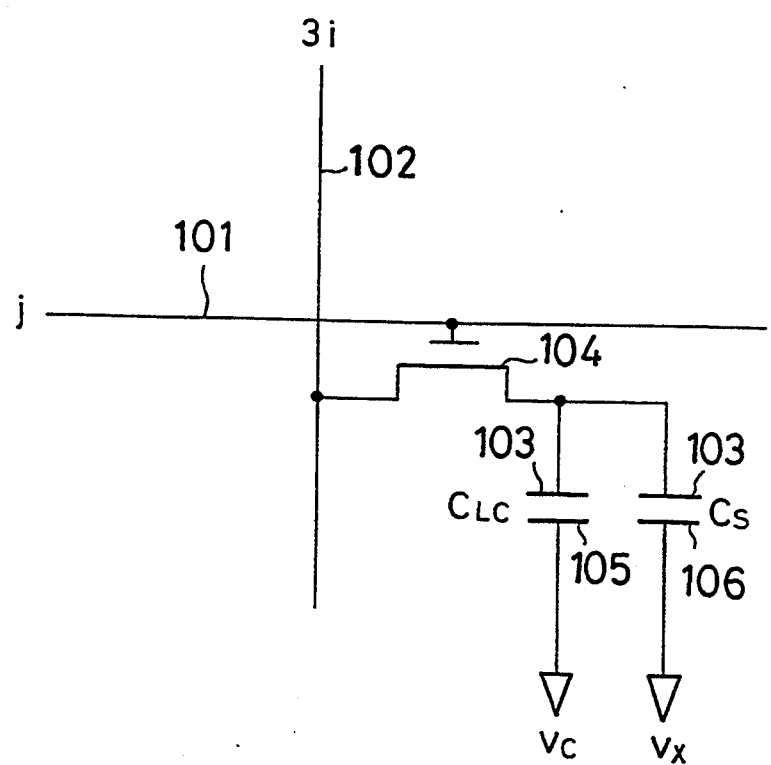
FIG. 4 is a circuit diagram showing an equivalent circuit to a pixel included in the display unit shown in FIG. 1.
Figure 5:
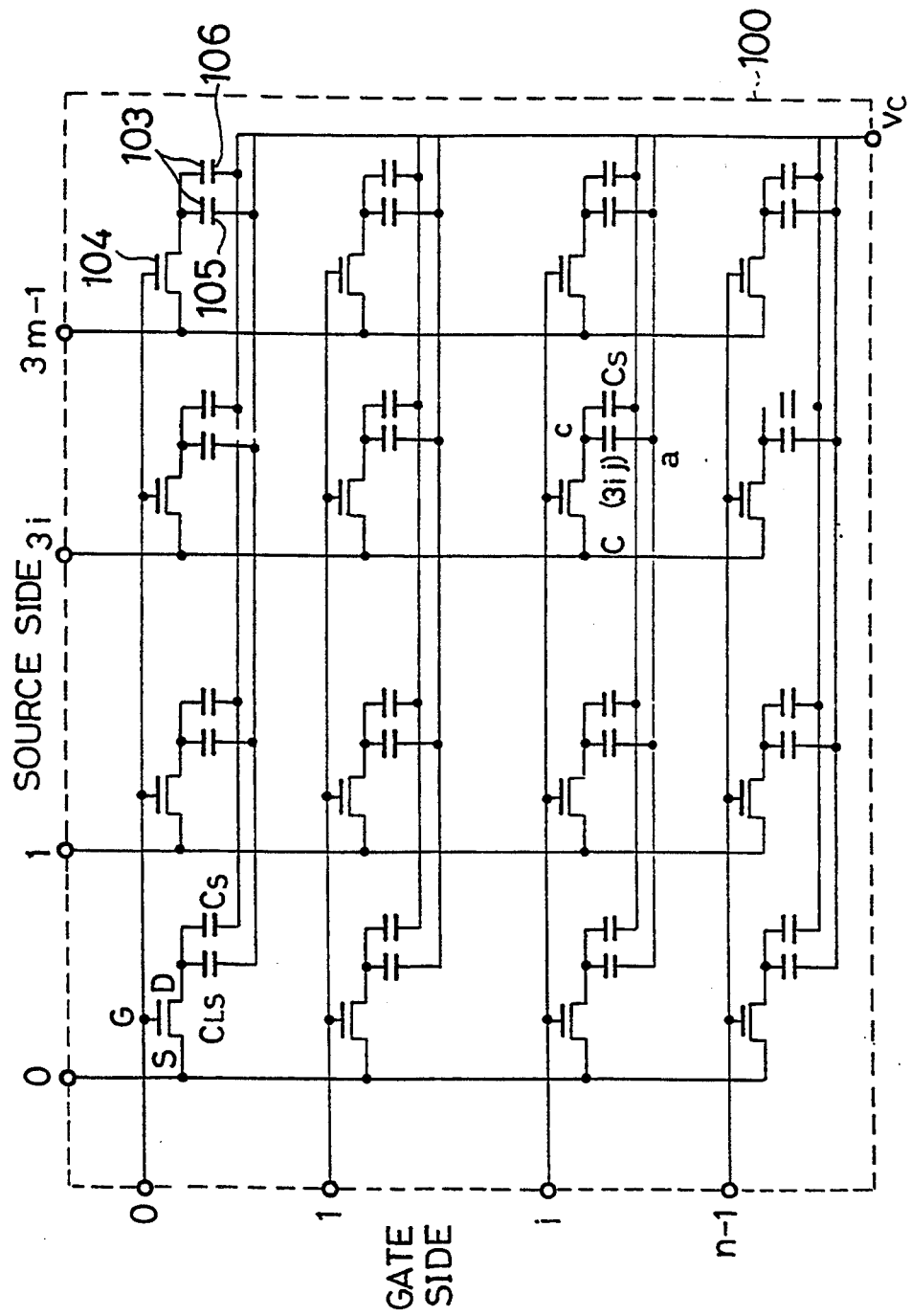
FIG. 5 is a circuit diagram showing a connecting arrangement of an auxiliary capacitance electrode to an opposite electrode included in the display unit shown in FIG. 1.
Figure 6:
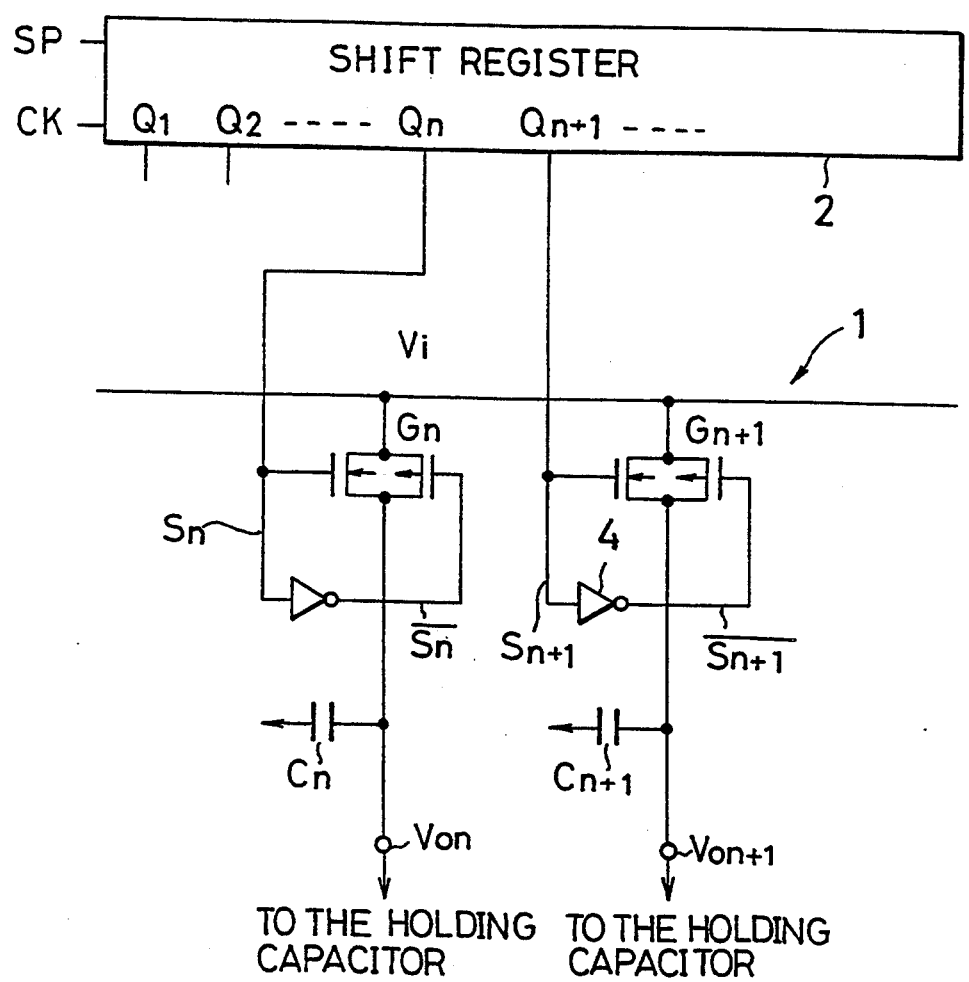
FIG. 6 is a circuit diagram showing a sample and hold circuit according to the related art of the present invention.
Figure 7:
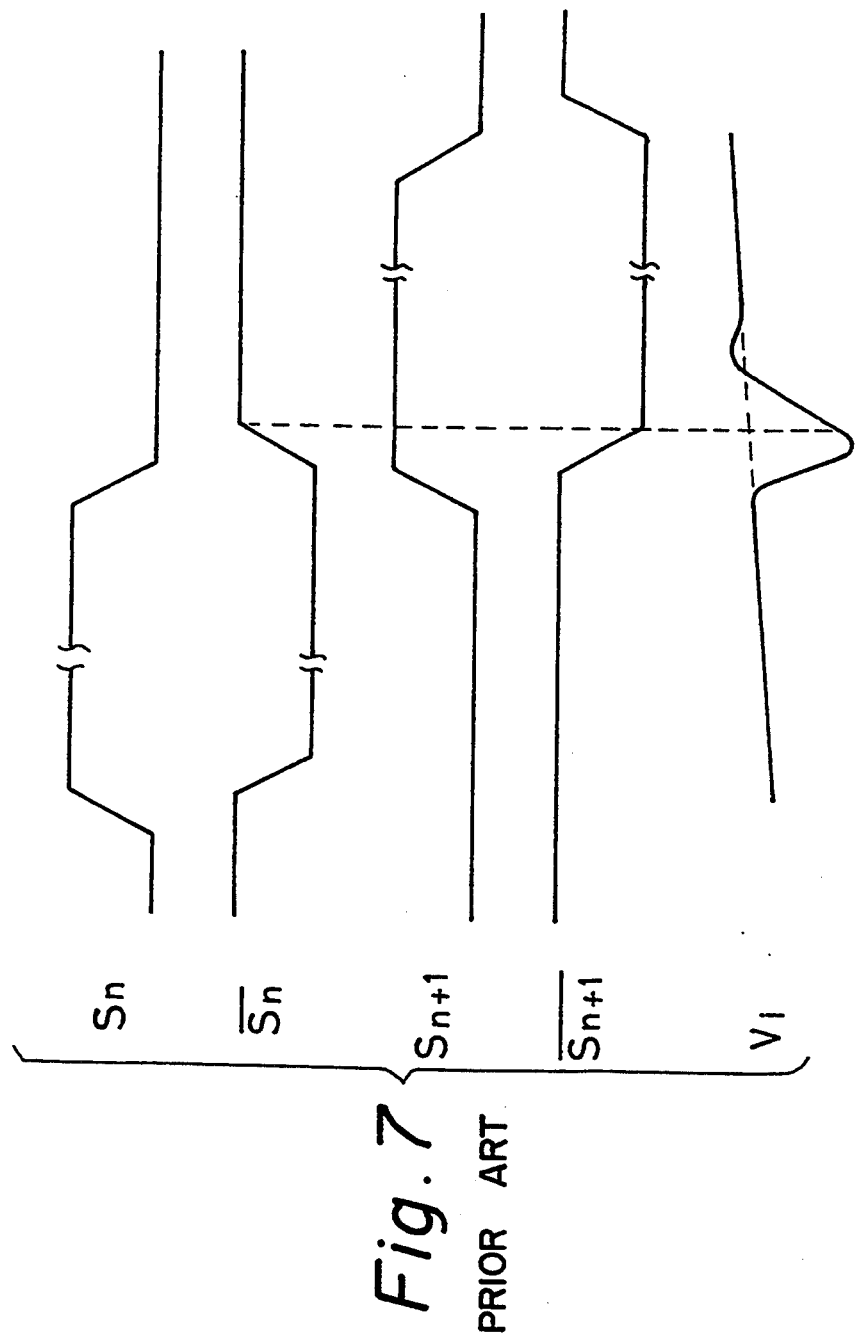
FIG. 7 is a timing chart showing the operations of the analog switches Qn and Qn+1 included in the sample and hold circuit shown in FIG. B.

The general frame of the sample and hold circuit arranged as above is shown in a timing chart of FIG. 3. When the sample and hold circuit is in operation, the sample pulse (SP) is input to the shift register 2 and the shift register serves to sequentially output a shift signal in synchronous to the clock (CK) signal so that the analog switches are sequentially switched on and off, for sampling the analog signal on the input bus line 1.

Figure 9:
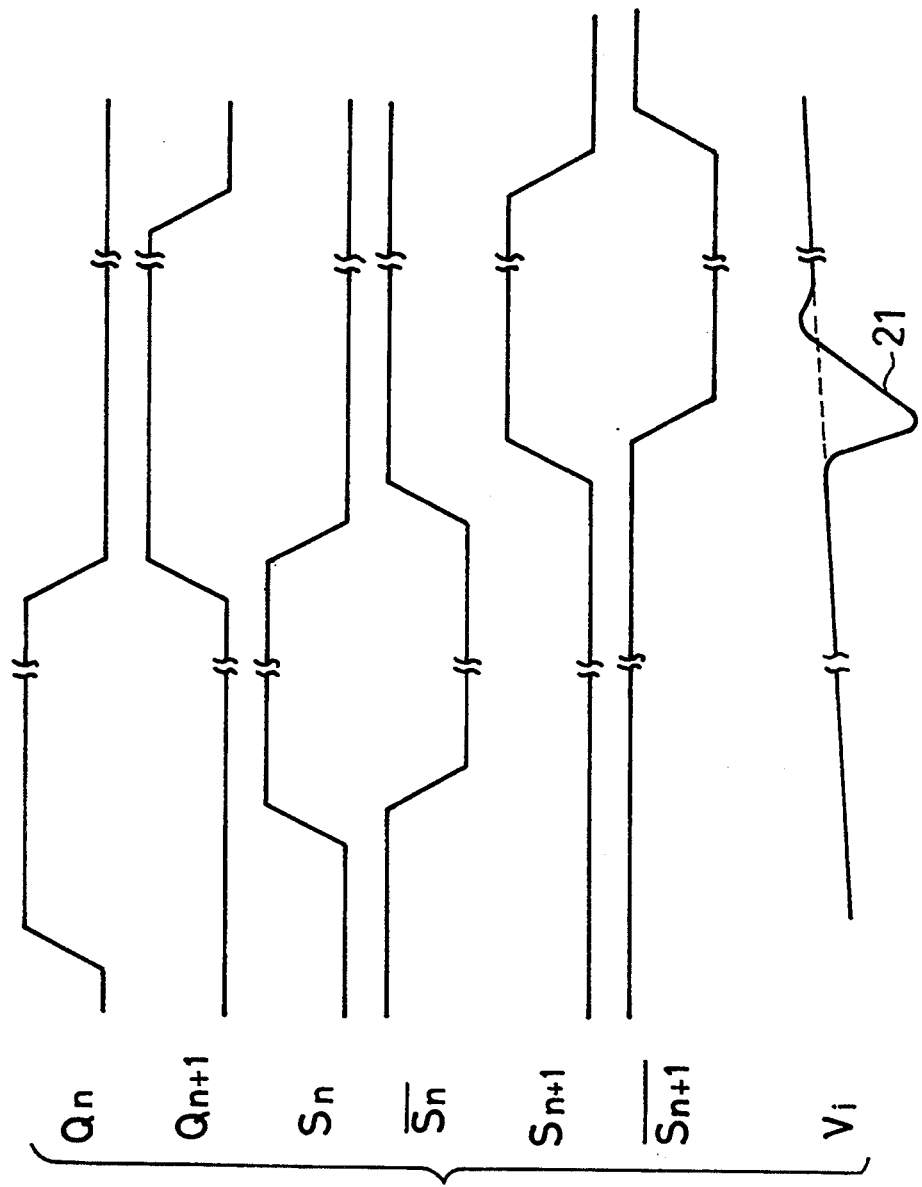
FIG. 9 is a timing chart showing the operations of analog switches Qn and Qn+1 included in the sample and hold circuit shown in FIG. 8.
Figure 10:
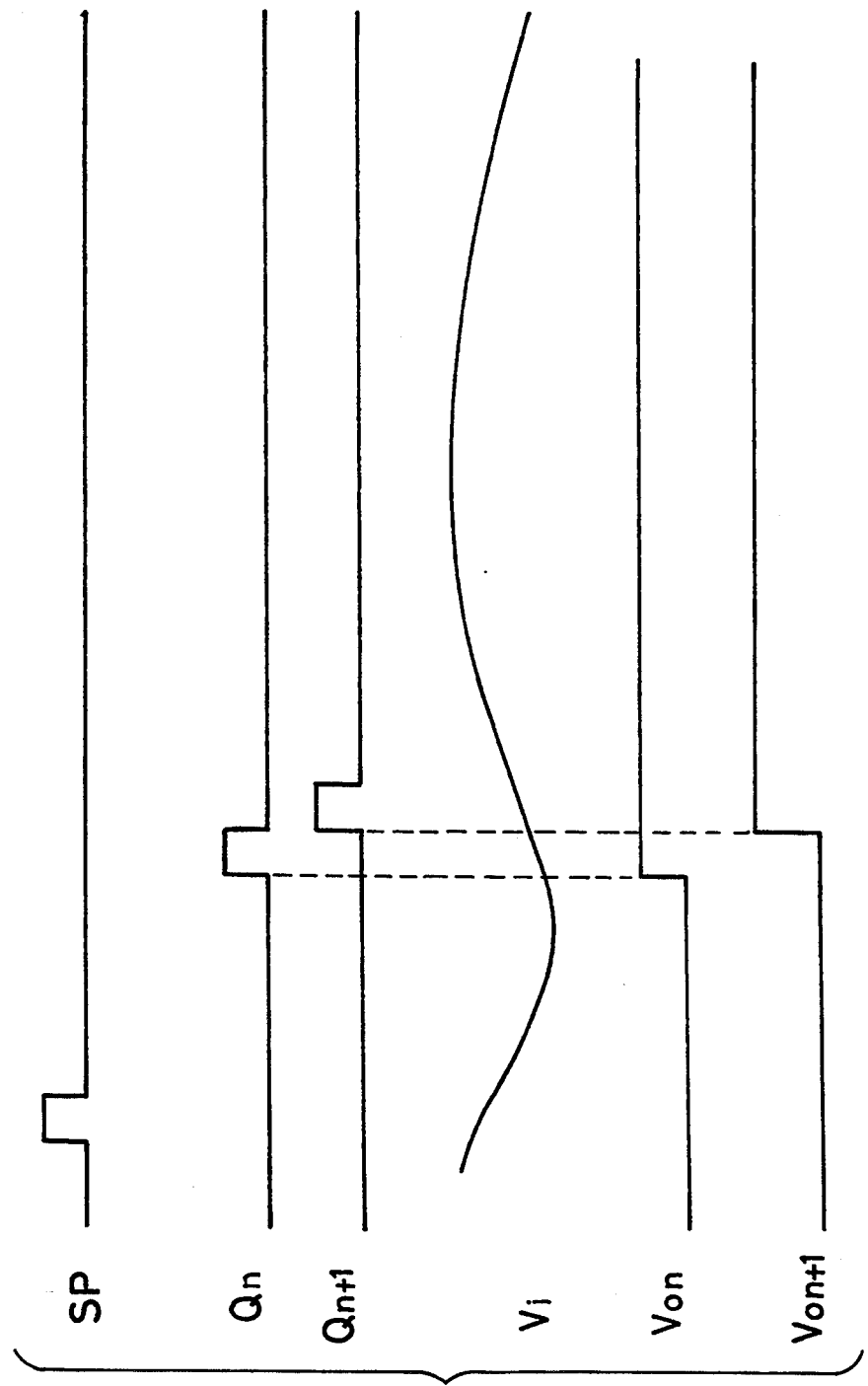
FIG. 10 is a timing chart showing the operation of the circuit shown in FIG. 8.

The timing chart of FIG. 9 shows a transition phenomenon on the sampling. The timing chart of FIG. 10 expansively stands for time points around sampling signals Qn and Qn+1.

Consider that the analog switches Gn and Gn+1 are sequentially switched on. The sampling gate signal Sn is "H", the inverted gate signal Sn is "L" and the analog switch Gn is switched on. In succession, the output sampling signal Qn+1 of the shift register rises to "H"

at a same time when Qn is at "L". Even if the AND circuit 3 pushes the sampling signal Gn+1 up to "H", the Nch gate signal Sn+1 of the analog switch Gn+1 does not rise to "H" unless the inverted gate signal Sn rises to "H". Hence, after the inverted gate signal Sn goes up to "H" and the analog switch Gn is completely switched off, the gate signal Sn+1 rises to "H" and the analog switch Gn+1 is switched off.

When the analog switch Gn+1 is switched on, the abrupt charge to the capacitor Cn+1 may take place in some values of the previous sampling level. In this case, the analog signal on the input bus line is adversely effected so that a noise 21 may appear on the line. In this embodiment, however, the analog switch Gn is completely switched off at this time. Hence, no adverse effect is given to the sampling level of the capacitor Cn. This relation is shown in FIG. 9.

In the embodiment shown in FIG. 8, the foregoing description is true to the case that the analog switch is composed of only one of Pch and Nch. In place of the AND gate included in this embodiment shown in FIG. 8, another clock signal may be used for composing the similar control circuit.

Many widely different embodiments of the present invention may be constructed without departing from the spirit and scope of the present invention. It should be understood that the present invention is not limited to the specific embodiments described in the specification, except as defined in the appended claims.

What is claimed is:

1. A sample and hold circuit comprising:
   a common input bus line on which an analog signal is to be applied;
   a plurality of combinations of analog switches and capacitors connected to said input bus line;
   means for sequentially supplying a sampling control signal to said analog switches; and
   means for preventing said plurality of analog switches from being made conductive at the same time.

2. The sample and hold circuit as claimed in claim 1, wherein each of said analog switches comprises a transmission gate having first and second gate inputs.

3. The sample and hold circuit as claimed in claim 2, wherein the first gate imput of each analog switch is connected to receive a sampling control signal and the second gate input is connected to receive an inverted sampling control signal inverted through an inverter.

4. The sample and hold circuit as claimed in claim 3, wherein said sampling control signal supplying means comprises a shift register having a plurality of output terminals.

5. The sample and hold circuit as claimed in claim 4, wherein said preventing means comprises a plurality of gate means, each connected between one respective output terminal of said shift register and one respective analog switch and having two inputs, a first input being connected to the respective output terminal of said shift register and a second input being connected to the second gate input of a respective analog switch connected to an output terminal of said shift register adjacent the respective output terminal.

6. The sample and hold circuit as claimed in claim 5, wherein each of said plurality of gate means has one output terminal connected to the first gate input of the respective analog switch.

7. The sample and hold circuit as claimed in claim 5, wherein each of said plurality of gate means comprises a logical AND circuit.

* * * * *